(12) United States Patent
Nishio et al.

(10) Patent No.: US 9,579,978 B2
(45) Date of Patent: Feb. 28, 2017

(54) IN-VEHICLE CHARGER

(71) Applicant: PANASONIC CORPORATION, Osaka (JP)

(72) Inventors: Tsuyoshi Nishio, Chiba (JP); Osamu Ohashi, Kanagawa (JP); Noriaki Asaoka, Kanagawa (JP); Akihiro Morimoto, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 56 days.

(21) Appl. No.: 14/381,298

(22) PCT Filed: Feb. 21, 2013

(86) PCT No.: PCT/JP2013/000963
§ 371 (c)(1),
(2) Date: Aug. 27, 2014

(87) PCT Pub. No.: WO2013/128851
PCT Pub. Date: Sep. 6, 2013

(65) Prior Publication Data
US 2015/0127201 A1 May 7, 2015

(30) Foreign Application Priority Data
Feb. 29, 2012 (JP) .................................. 2012-043048

(51) Int. Cl.
*B60L 3/04* (2006.01)
*B60L 3/00* (2006.01)
(Continued)

(52) U.S. Cl.
CPC ...... *B60L 3/04* (2013.01); *B60L 3/00* (2013.01); *B60L 3/0069* (2013.01);
(Continued)

(58) Field of Classification Search
CPC ...... B60L 2210/30; B60L 3/0069; B60L 3/04; H02H 3/16; H02H 3/17
(Continued)

(56) References Cited

U.S. PATENT DOCUMENTS 6,556,395 B1 * 4/2003 Chan ........................ H02H 3/33
361/42
8,355,226 B2 1/2013 Yoshida et al.
(Continued)

FOREIGN PATENT DOCUMENTS

CN 102033186 A 4/2011
CN 201828640 U 5/2011
(Continued)

OTHER PUBLICATIONS

International Search Report for Application No. PCT/JP2013/000963 dated May 7, 2013.
(Continued)

*Primary Examiner* — John Q Nguyen
*Assistant Examiner* — Anshul Sood
(74) *Attorney, Agent, or Firm* — Pearne & Gordon LLP

(57) ABSTRACT

The present invention is an in-vehicle charger for detecting ground faults originating in sections in which alternating current is flowing. This device is an in-vehicle charger (100) for charging a vehicle-mounted battery, wherein the device is provided with: a bridge rectifier (14) for converting alternating current supplied from a power source to direct current; a ground fault detecting circuit (21) for outputting a test voltage when a test current flows in a circuit in the in-vehicle charger (100) and, based on changes in the test current in response to the presence or absence of a ground fault resistor, for detecting a ground fault in the circuit of the in-vehicle charger (100); and a controller (23) for controlling the ground fault sensing circuit (21) so as to output a test
(Continued)

voltage exceeding the forward voltage of a diode provided by the bridge rectifier (14).

3 Claims, 6 Drawing Sheets

(51) Int. Cl.
    *H02H 3/16*     (2006.01)
    *B60L 11/18*     (2006.01)
    *G01R 31/00*     (2006.01)
    *G01R 31/02*     (2006.01)
    *H02J 7/00*     (2006.01)
    *H02H 3/17*     (2006.01)

(52) U.S. Cl.
    CPC ........ *B60L 11/1809* (2013.01); *G01R 31/006* (2013.01); *G01R 31/025* (2013.01); *H02H 3/16* (2013.01); *H02H 3/17* (2013.01); *H02J 7/0031* (2013.01); *B60L 2210/30* (2013.01); *Y02T 10/7005* (2013.01); *Y02T 10/7072* (2013.01); *Y02T 10/7241* (2013.01); *Y02T 90/127* (2013.01); *Y02T 90/14* (2013.01)

(58) Field of Classification Search
    USPC .......................................................... 701/70
    See application file for complete search history.

(56) References Cited

U.S. PATENT DOCUMENTS

| | | | | |
|---|---|---|---|---|
| 2010/0295568 | A1* | 11/2010 | Ostrovsky | G01R 31/3277 324/750.3 |
| 2011/0080676 | A1 | 4/2011 | Yoshida et al. | |
| 2011/0084548 | A1* | 4/2011 | Gale | B60L 1/00 307/9.1 |
| 2012/0043967 | A1* | 2/2012 | Miura | B60L 3/0069 324/426 |
| 2012/0087050 | A1* | 4/2012 | Ritzinger | H02H 3/335 361/42 |
| 2013/0147491 | A1* | 6/2013 | Kawamura | G01R 27/18 324/509 |

FOREIGN PATENT DOCUMENTS

| | | | |
|---|---|---|---|
| JP | 07-146321 | A | 6/1995 |
| JP | 09-065509 | A | 3/1997 |
| JP | 2000-184778 | A | 6/2000 |
| JP | 2003-250201 | A | 9/2003 |
| JP | 3563967 | B2 | 9/2004 |
| JP | 2005-304138 | A | 10/2005 |
| JP | 2010-178422 | A | 8/2010 |
| JP | 2011-035985 | A | 2/2011 |
| JP | 4802232 | B2 | 10/2011 |
| JP | 2011-220812 | A | 11/2011 |
| JP | 2012-037278 | A | 2/2012 |
| WO | 2012/020733 | A1 | 2/2012 |
| WO | WO -2012020733 | A1 * | 2/2012 ............. G01R 27/18 |

OTHER PUBLICATIONS

English Translation of Search Report for CN201380007945.X dated Nov. 17, 2015.

Supplemental European Search Report for Application No. 13 75 4081 Dated Nov. 5, 2015.

\* cited by examiner

IN-VEHICLE CHARGER

TECHNICAL FIELD

The present invention relates to an in-vehicle charging apparatus which charges a battery mounted on a vehicle, using a predetermined power supply.

BACKGROUND ART

Since a high-voltage battery is mounted on a vehicle such as an electric automobile or a hybrid automobile, there is a need to provide a ground fault detector in order to ensure the safety of a passenger.

As an example of the ground fault detector, for example, PTL 1 discloses a vehicle ground fault detecting apparatus which highly precisely detects a ground fault of a DC power supply (battery). The vehicle ground fault detecting apparatus applies a rectangular wave pulse signal to one end (a measurement point A) of a coupling capacitor, obtains a measurement voltage when the rectangular wave pulse signal is an H level and a measurement voltage when the rectangular wave pulse signal is an L level, and detects an occurrence of a ground fault based on a difference between the measurement voltages.

CITATION LIST

Patent Literature

PTL 1
Japanese Patent Application Laid-Open No. 2003-250201

SUMMARY OF INVENTION

Technical Problem

However, the vehicle ground fault detecting apparatus of PTL 1 has the following problem.

In the vehicle ground fault detecting apparatus of PTL 1, when the DC power supply is charged through a charger including a bridge rectifier from a commercial power supply, a direct current which is converted from an alternating current by the bridge rectifier is supplied to the DC power supply. In such case, even when a rectangular wave pulse signal for detecting a ground fault is outputted, a test current does not flow through an interval where the alternating current flows if a test voltage for detecting the ground fault is smaller than a forward voltage (Vf) of a diode constituting the bridge rectifier. For this reason, the ground fault occurring in the interval where the alternating current flows cannot be detected.

Due to the above-described circumstance, there arises a problem in that although the vehicle ground fault detecting apparatus of PTL 1 can detect a ground fault occurring in the interval where a direct current flows, but cannot detect a ground fault occurring in the interval where an alternating current flows.

An object of the invention is to provide an in-vehicle charging apparatus capable of detecting a ground fault occurring in the interval where an alternating current flows.

Solution to Problem

An in-vehicle charging apparatus according to an aspect of the present invention is an apparatus that charges a battery mounted on a vehicle, the apparatus including: a bridge rectifier that converts an alternating current supplied from a power supply into a direct current; a ground fault detecting circuit that is provided at a side of the bridge rectifier where the direct current obtained by the conversion of the bridge rectifier flows, that outputs a test voltage, and that detects a ground fault occurring in the in-vehicle charging apparatus, based on a test current which changes in response to the presence or absence of a ground fault resistance; and a control section that controls the ground fault detecting circuit so that the ground fault detecting circuit outputs the test voltage of a value larger than a forward voltage of a diode included in the bridge rectifier.

Advantageous Effects of Invention

According to the invention, it is possible to detect a ground fault occurring in the interval where an alternating current flows.

DESCRIPTION OF EMBODIMENTS

Hereinafter, an embodiment of the invention will be described in detail with reference to the accompanying drawings.

(Embodiment)

Figure 1:
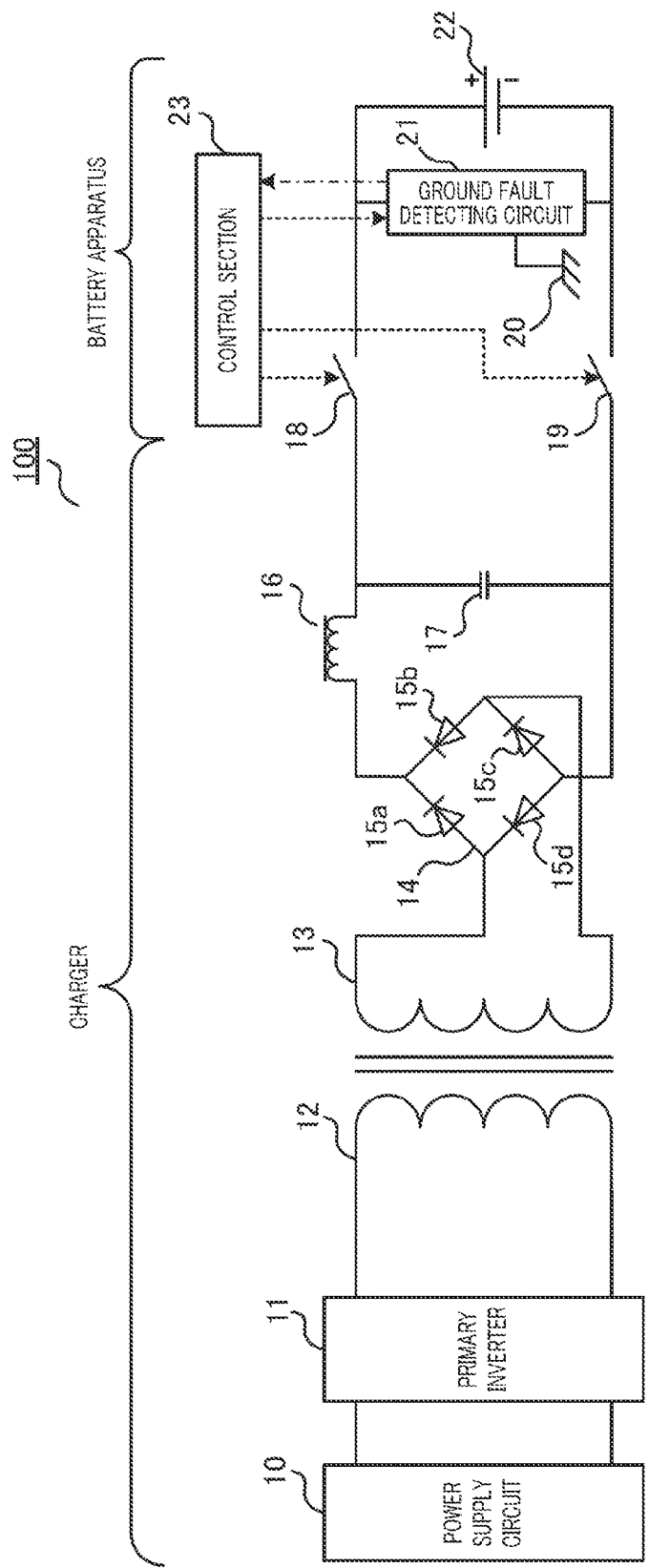
FIG. 1 is a diagram illustrating the configuration of an in-vehicle charging apparatus according to an embodiment of the present invention.

FIG. 1 is a diagram illustrating the configuration of in-vehicle charging apparatus 100 according to the embodiment of the present invention.

In-vehicle charging apparatus 100 includes a charger and a battery apparatus. The charger includes power supply circuit 10, primary inverter 11, primary transformer 12, secondary transformer 13, bridge rectifier 14, choke coil 16, and capacitor 17. Further, the battery apparatus includes P-side relay 18, N-side relay 19, vehicle-side GND (ground) 20, ground fault detecting circuit 21, battery 22, and control section 23.

In the charger, an alternating current which is supplied from the primary side (power supply circuit 10, primary inverter 11, and primary transformer 12) is inputted to secondary transformer 13.

Secondary transformer 13 steps up or down the alternating current inputted from primary transformer 12 and inputs the result to bridge rectifier 14.

Bridge rectifier 14 converts the alternating current inputted from secondary transformer 13 into a direct current after the rectification thereof, and inputs the direct current to choke coil 16. Bridge rectifier 14 includes diodes 15a, 15b, 15c, and 15d.

Furthermore, in the description below, the interval on the left side of bridge rectifier 14 as a boundary in the drawing, for example, the interval between bridge rectifier 14 and secondary transformer 13 (on the side of bridge rectifier 14 which is opposite to ground fault detecting circuit 21) is referred to as an "AC interval" in that an alternating current flows through the interval. Meanwhile, the interval on the right side of bridge rectifier 14 as a boundary in the drawing, for example, the interval between bridge rectifier 14 and battery 22 (on the side of bridge rectifier 14 where ground fault detecting circuit 21 exists) is referred to as a "DC interval" in that a direct current flows through the interval.

Choke coil 16 is configured with a predetermined impedance and constitutes a low-pass filter along with capacitor 17. Then, when P-side relay 18 is connected (becomes an ON state) by the control of control section 23, choke coil 16 smoothes the direct current inputted from bridge rectifier 14 in cooperation with capacitor 17.

The smoothed direct current is inputted to battery 22 as a secondary battery. Accordingly, battery 22 is charged.

Control section 23 controls ON (connection)/OFF (disconnection) states of P-side relay 18 and N-side relay 19. Further, control section 23 controls an operation involving the ground fault detection of ground fault detecting circuit 21. The arrows indicated by the dashed lines illustrated in FIG. 1 indicate a control signal (an instruction and a command) from control section 23.

Further, control section 23 includes, for example, a central processing unit (CPU), a read only memory (ROM), and a random access memory (RAM). Control section 23 performs the above-described control and other controls involving in-vehicle charging apparatus 100 in a manner such that a CPU executes a program stored in a ROM, using a RAM.

Upon reception of an instruction for performing a ground fault detection and an instruction for a value of a test voltage to be outputted (applied) from control section 23, ground fault detecting circuit 21 outputs a test voltage of the instructed value in order to detect a ground fault occurring in in-vehicle charging apparatus 100. The test voltage may be outputted as a DC voltage or an AC voltage. At this time, P-side relay 18 and N-side relay 19 become an ON (connection) state by the control of control section 23.

When the test voltage is outputted from ground fault detecting circuit 21, a test current changes in in-vehicle charging apparatus 100 in response to the occurrence of the ground fault. Ground fault detecting circuit 21 detects the occurrence of the ground fault based on a change in the test current.

That is, a test current larger than a predetermined value flows when the ground fault occurs in the case where the test voltage is outputted, but only a test current of a value smaller than the predetermined value flows when no ground fault occurs in the same case.

Accordingly, ground fault detecting circuit 21 detects the occurrence of the ground fault if a state where the test current becomes larger than the predetermined value is detected when the test voltage is outputted, and detects that no ground fault occurs if a state where the test current becomes larger than the predetermined value is not detected. The predetermined value is set in advance for the test voltage in the state where no ground fault occurs, so that the predetermined value becomes larger than the test current obtained when the ground fault caused by the impedance among the DC interval, the AC interval, and the vehicle body does not occur.

Furthermore, a route through which the test current flows when the ground fault occurs becomes a route having the lowest impedance. Further, the arrow of the one-dotted chain line illustrated in FIG. 1 indicates a detection result signal (which will be described in detail later) to control section 23. Further, the method of the ground fault detection which is performed by ground fault detecting circuit 21 may be, for example, a method disclosed in PTL 1. That is, a method which is generally used in the related art may be employed.

Hereinafter, a description will be given of examples of the ground fault detection which is performed by in-vehicle charging apparatus 100 with reference to FIGS. 2 to 4.

Figure 2:
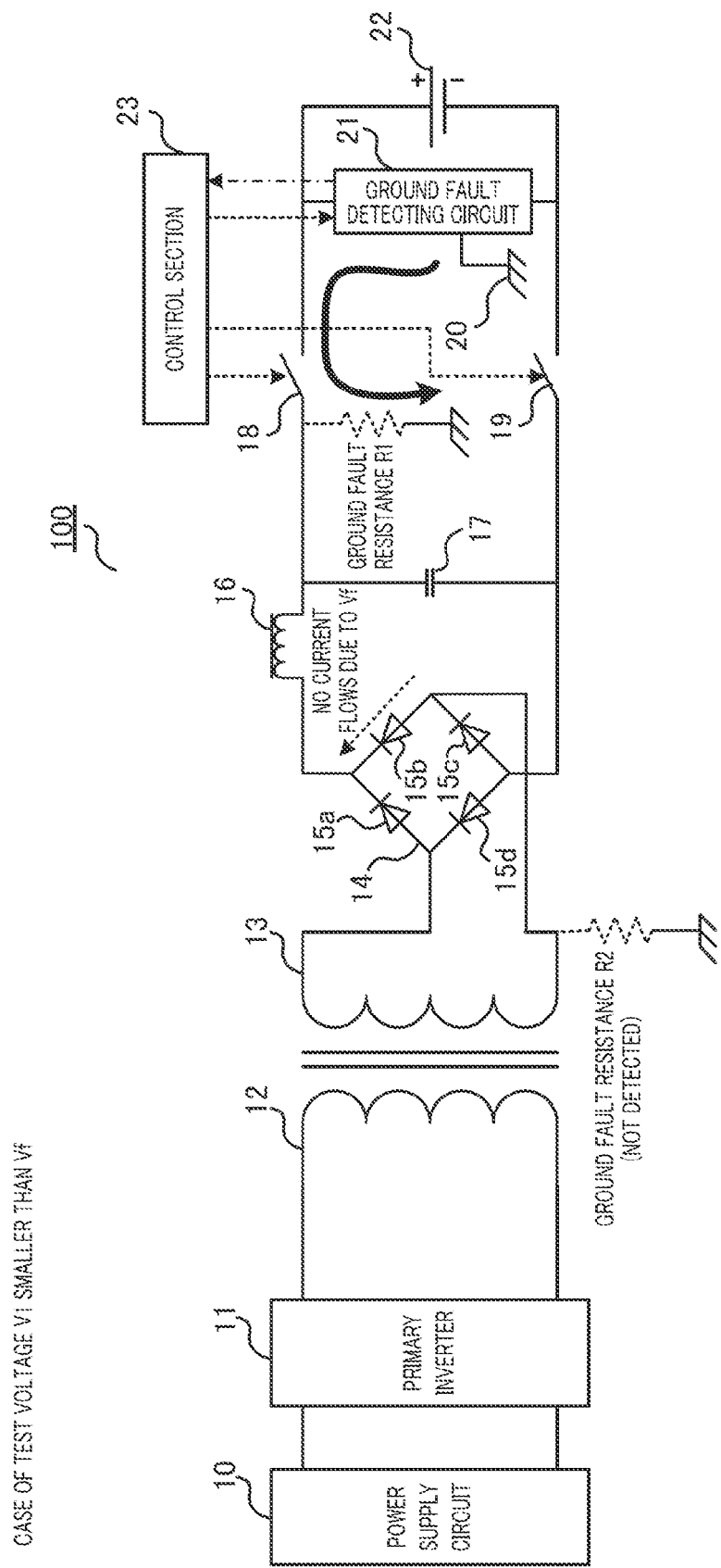
FIG. 2 is a diagram illustrating a case where a test voltage in the in-vehicle charging apparatus according to the embodiment of the present invention is smaller than Vf.

FIG. 2 illustrates a case where value V1 of a test voltage instructed from control section 23 to ground fault detecting circuit 21 is smaller than a forward voltage Vf of diode 15a, 15b, or the like included in bridge rectifier 14. When the ground fault occurs when the test voltage V1 is outputted from ground fault detecting circuit 21, a test current larger than the predetermined value flows, and the test current is smaller than the predetermined value when the ground fault does not occur. Furthermore, the forward voltage Vf is, for example 0.5 V to 2 V.

In the case of FIG. 2, since test voltage V1 is smaller than forward voltage Vf, the test current may not flow through, for example, diode 15b. Accordingly, the test current does not flow through the AC interval and flows only through the DC interval. The arrow indicated by the bold line illustrated in FIG. 2 indicates the test current which flows in the event of ground fault resistance R1.

Accordingly, in the case of FIG. 2, ground fault detecting circuit 21 cannot detect the ground fault occurring in the AC interval (for example, a ground fault resistance R2), but can detect the ground fault occurring only in the DC interval (for example, the ground fault resistance R1).

Figure 3:
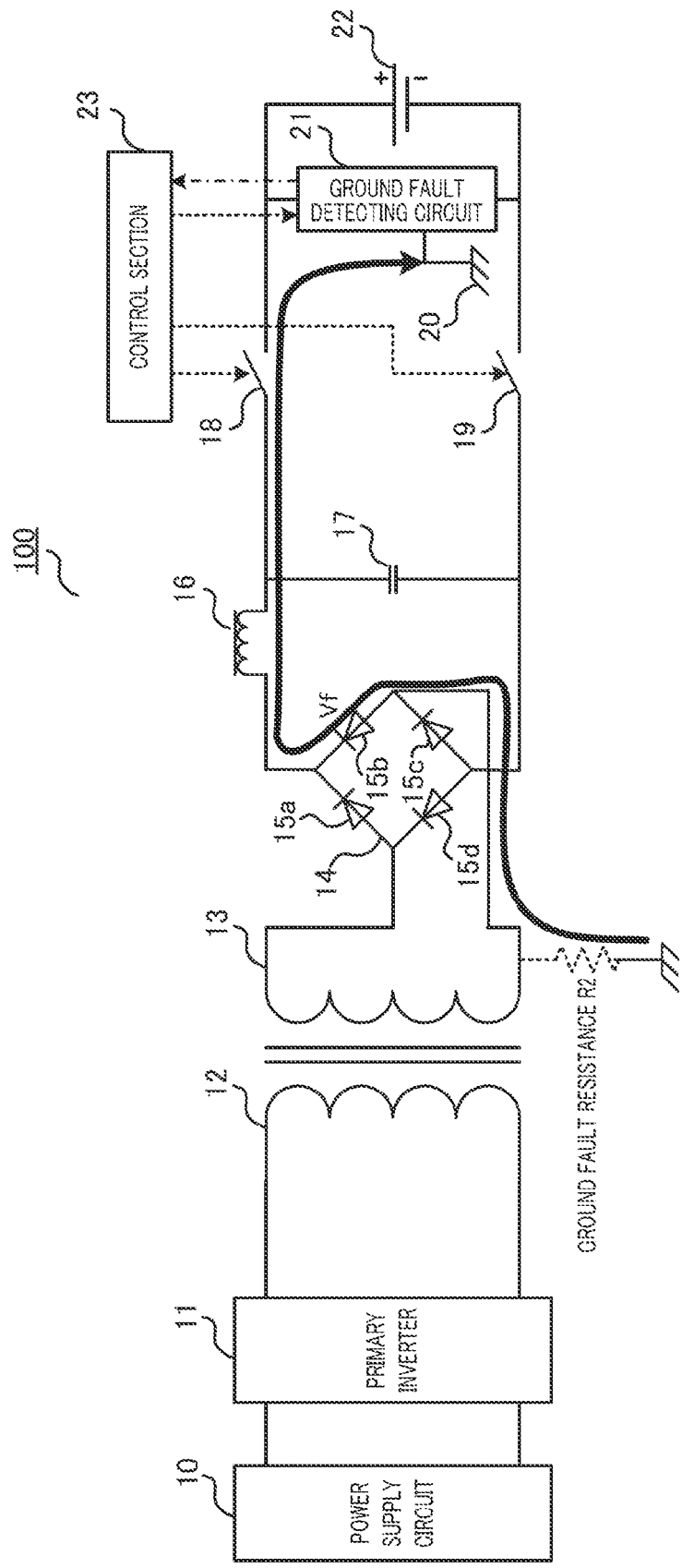
FIG. 3 is a diagram illustrating a case where the test voltage in the in-vehicle charging apparatus according to the embodiment of the present invention is larger than Vf.

FIG. 3 illustrates a case where value V2 of a test voltage instructed from control section 23 to ground fault detecting circuit 21 is larger than forward voltage Vf of diode 15a, 15b, or the like included in bridge rectifier 14. Ground fault detecting circuit 21 can output an AC voltage as a test voltage. The "state where value V2 of the test voltage is larger than forward voltage Vf of diode 15a, 15b, or the like" means that control section 23 performs a control so that the amplitude of the AC voltage outputted from ground fault detecting circuit 21 is larger than forward voltage Vf. In a case where the test voltage V2 is outputted from ground fault detecting circuit 21, When the ground fault occurs in the case where the test voltage V2 is outputted from ground fault detecting circuit 21, the test current becomes larger than the predetermined value if the ground fault occurs, and the test current becomes smaller than the predetermined value if no ground fault occurs in this case.

In the case of FIG. 3, since test voltage V2 is larger than forward voltage Vf, the test current may flow through diode 15b, for example. Accordingly, the test current flows through the AC interval. The arrow of the bold line illustrated in FIG. 3 indicates the test current which flows in the event of ground fault resistance R2.

Accordingly, in the case of FIG. 3, ground fault detecting circuit 21 can detect the ground fault occurring in the AC interval (for example, the ground fault resistance R2).

Figure 4:
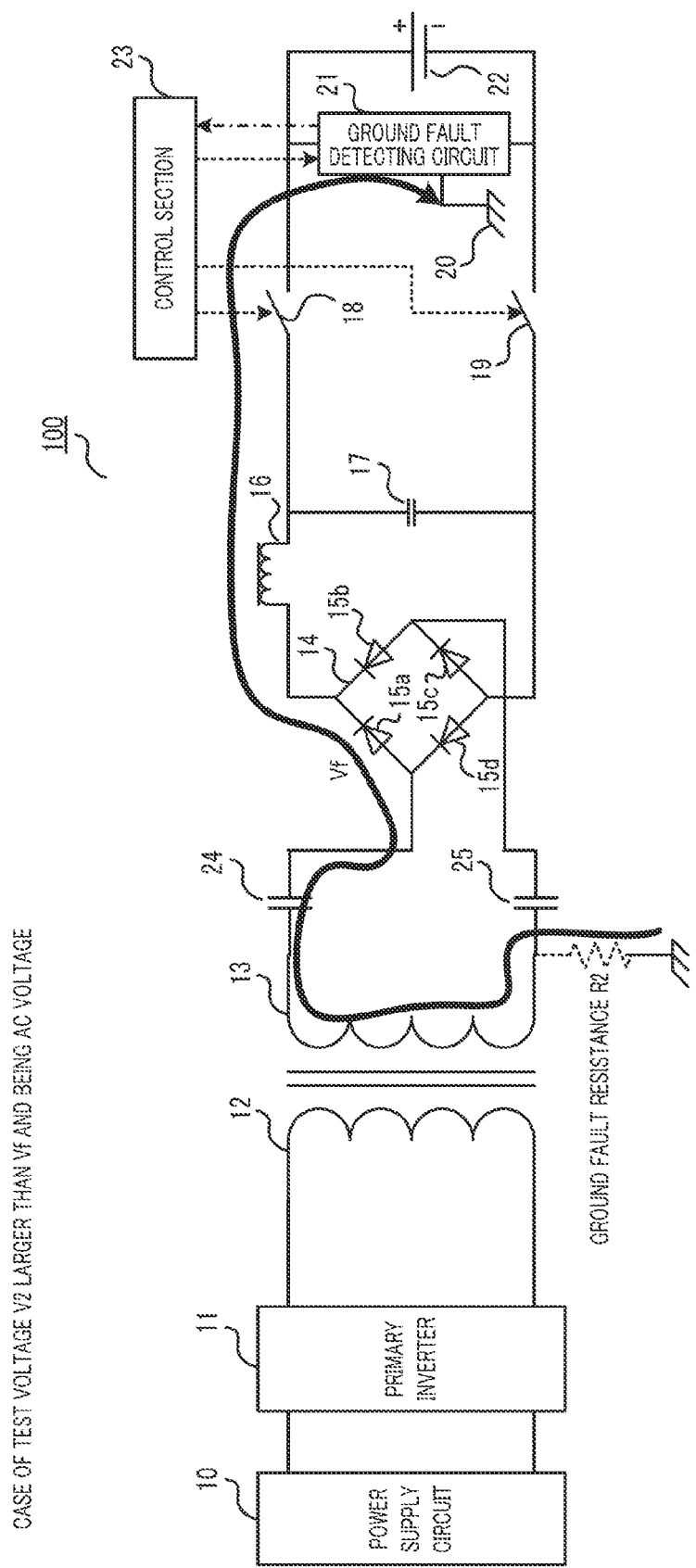
FIG. 4 is a diagram illustrating a case where the test voltage in the in-vehicle charging apparatus according to the embodiment of the present invention is larger than Vf and is an AC voltage.

FIG. 4 illustrates a case where value V2 of the test voltage instructed from control section 23 to ground fault detecting circuit 21 is larger than forward voltage Vf of diode 15a, 15b, or the like included in bridge rectifier 14 and test voltage V2 is an AC voltage. The configuration illustrated in FIG. 4 is different from the configurations illustrated in FIGS. 1 to 3 in that resonance capacitors 24 and 25 are provided between bridge rectifier 14 and secondary transformer 13.

When the AC interval is provided with resonance capacitors 24 and 25, test voltage V2 needs to be larger than forward voltage Vf and needs to be an AC voltage in order that the test voltage V2 flows through the AC interval so as to detect the ground fault between secondary transformer 13 and resonance capacitors 24 and 25. Therefore, in the case of the configuration illustrated in FIG. 4, a voltage which is outputted from ground fault detecting circuit 21 is set as an AC voltage in advance.

In the case of FIG. 4, since test voltage V2 is larger than forward voltage Vf and is an AC voltage, the test current can flow through the AC interval provided with resonance capacitors 24 and 25. The arrow of the bold line illustrated in FIG. 4 indicates the test current flowing in the event of ground fault resistance R2.

Accordingly, in the case of FIG. 4, ground fault detecting circuit 21 can detect the ground fault occurring in the AC interval (for example, the ground fault resistance R2).

As described above, in in-vehicle charging apparatus 100 of the embodiment, the test voltage which is outputted from ground fault detecting circuit 21 is variable. Accordingly, the ground fault occurring in the DC interval can be detected by setting the test voltage to be outputted to a value smaller than the forward voltage of the diode, and the ground fault occurring in the AC interval can be detected by setting the test voltage to be outputted to a value larger than the forward voltage of the diode. Further, since the test voltage to be outputted is set to a value larger than the forward voltage of the diode and is set to an AC voltage, it is possible to detect the ground fault occurring in the AC interval provided with the resonance capacitor.

Next, an operation example according to the ground fault detection of in-vehicle charging apparatus 100 will be described with reference to FIGS. 5 and 6.

OPERATION EXAMPLE 1

Figure 5:
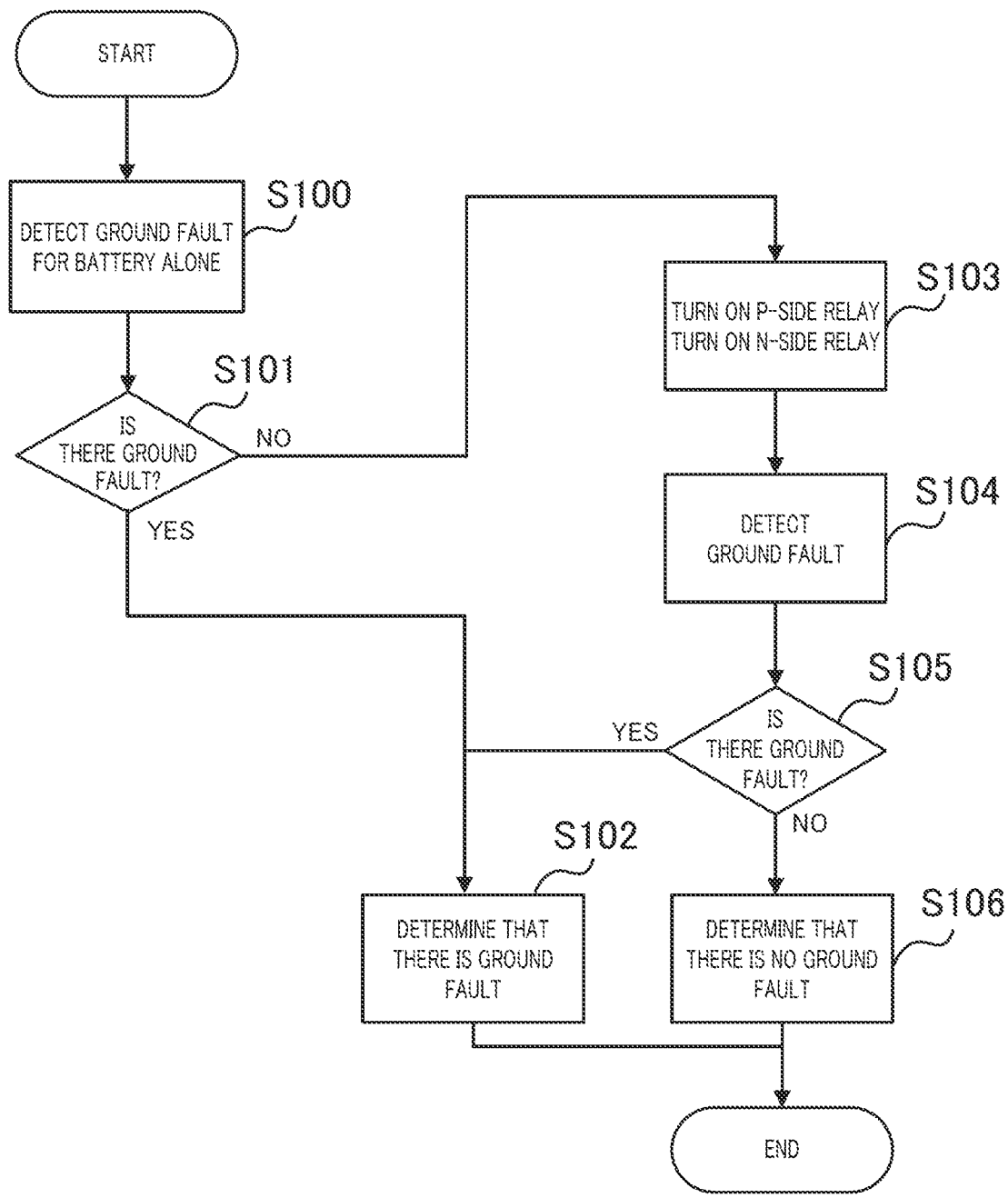
FIG. 5 is a flowchart illustrating an example of a ground fault detection operation of the in-vehicle charging apparatus according to the embodiment of the present invention.

FIG. 5 is a flowchart illustrating operation example 1 of in-vehicle charging apparatus 100. The operation illustrated in FIG. 5 is performed before charging, for example.

First, ground fault detection for battery 22 alone is performed (step S100). That is, control section 23 performs a control so that P-side relay 18 and N-side relay 19 become an OFF state and instructs ground fault detecting circuit 21 to perform the ground fault detection and instructs ground fault detecting circuit 21 to use a value of the test voltage to be outputted. This value is, for example, value V1 smaller than that of forward voltage Vf. Ground fault detecting circuit 21 which receives the instruction from control section 23 outputs a test voltage of the instructed value and performs ground fault detection based on a magnitude relation between the test current and the predetermined value.

When ground fault detecting circuit 21 detects a test current larger than the predetermined value (YES in step S101), a signal indicating the detection result (a detection result signal) is outputted to control section 23.

Upon reception of a detection result signal indicating that the test current larger than the predetermined value has been detected from ground fault detecting circuit 21 as input, control section 23 determines that a ground fault exists (a ground fault occurs) (step S102). This determination result may be output from an indicator (not illustrated), for example.

Meanwhile, when not detecting a test current larger than the predetermined value (NO in step S101), ground fault detecting circuit 21 outputs a detection result signal indicating the detection result to control section 23.

Upon reception of a detection result signal indicating that a test current larger than the predetermined value has not been detected from ground fault detecting circuit 21 as input, control section 23 turns on P-side relay 18 and N-side relay 19 (step S 103).

Here, ground fault detection is performed on the AC interval of in-vehicle charging apparatus 100 (step S104). That is, control section 23 instructs ground fault detecting circuit 21 to perform the ground fault detection and instructs ground fault detecting circuit 21 to use a value of the test voltage to be outputted. This value is, for example, value V2 larger than forward voltage Vf. Then, upon reception of the instruction from control section 23, ground fault detecting circuit 21 outputs a test voltage of the instructed value and performs ground fault detection based on the magnitude relation between the test current and the predetermined value.

When detecting a test current larger than the predetermined value (YES in step S105), ground fault detecting circuit 21 outputs a detection result signal indicating the detection result to control section 23. Subsequently, the operation proceeds to step S102 described above.

Meanwhile, when not detecting a test current larger than the predetermined value (NO in step S105), ground fault detecting circuit 21 outputs a detection result signal indicating the detection result to control section 23.

Upon reception of a detection result signal indicating that a test current larger than the predetermined value has not been detected from ground fault detecting circuit 21 as input, control section 23 determines that there is no ground fault (ground fault does not occur) (step S106). The determination result may be outputted using an indicator (not illustrated), for example. After step S106, the charging operation for battery apparatus 2 starts.

The description of operation example 1 has been given thus far.

Furthermore, in operation example 1, the target of the ground fault detection in step S104 can be a DC interval. Further, in operation example 1, the test voltage can be an AC voltage.

OPERATION EXAMPLE 2

Figure 6:
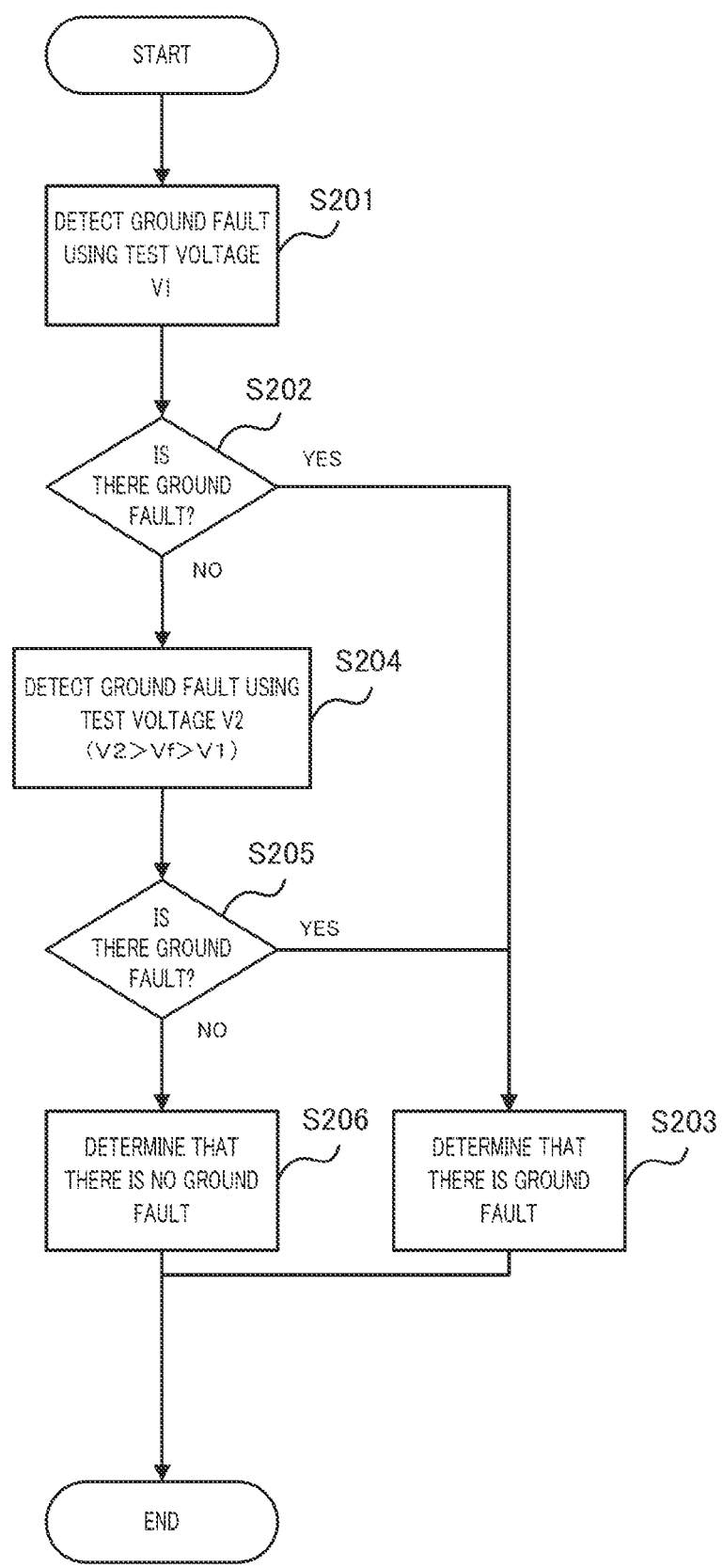
FIG. 6 is a flowchart illustrating an example of a test voltage conversion operation of the in-vehicle charging apparatus according to the embodiment of the present invention.

FIG. 6 is a flowchart illustrating operation example 2 of in-vehicle charging apparatus 100. The operation illustrated in FIG. 6 may be replaced by step S104 and step S105 of operation example 1.

First, a ground fault detection using test voltage V1 is performed (step S201). That is, control section 23 instructs ground fault detecting circuit 21 to perform the ground fault detection and instructs ground fault detecting circuit 21 to use value V1 of the test voltage to be outputted. This value V1 is smaller than that of forward voltage Vf. Upon reception of the instruction from control section 23, ground fault detecting circuit 21 outputs a test voltage of the instructed value V1 and performs ground fault detection on the DC interval based on the magnitude relation between the test current and the predetermined value.

When detecting a test current larger than the predetermined value (YES in step S202), ground fault detecting circuit 21 outputs a detection result signal indicating the detection result to control section 23.

Upon reception of a detection result signal indicating that a test current larger than the predetermined value has been detected from ground fault detecting circuit 21 as input, control section 23 determines that there is a ground fault (ground fault occurs) in the DC interval (step S203). The determination result may be outputted using an indicator (not illustrated), for example.

Meanwhile, when not detecting a test current larger than the predetermined value (NO in step S202), ground fault detecting circuit 21 outputs a detection result signal indicating the detection result to control section 23.

Upon reception of a detection result signal indicating that a test current larger than the predetermined value is not detected from ground fault detecting circuit 21 as input, control section 23 determines that there is a ground fault (ground fault occurs) in the AC interval (step S203).

Next, ground fault detection using test voltage V2 is performed (step S204). That is, control section 23 instructs ground fault detecting circuit 21 to perform the ground fault detection and instructs ground fault detecting circuit 21 to use value V2 of the test voltage to be outputted. This value V2 is larger than that of forward voltage Vf. Upon reception of the instruction from control section 23, ground fault detecting circuit 21 outputs a test voltage of the instructed value V2 and performs ground fault detection on the AC interval in addition to the DC interval based on the magnitude relation between the test current and the predetermined value.

When detecting a test current larger than the predetermined value (YES in step S205), ground fault detecting circuit 21 outputs a detection result signal indicating the detection result to control section 23. Subsequently, the procedure proceeds to step S203 described above.

Meanwhile, when not detecting a test current larger than the predetermined value (NO in step S205), ground fault detecting circuit 21 outputs a detection result signal indicating the detection result to control section 23.

Upon reception of a detection result signal indicating that a test current larger than the predetermined value has not been detected from ground fault detecting circuit 21 as input, control section 23 determines that there is no ground fault (ground fault does not occur) in the AC interval in addition to the DC interval (step S206). This determination result may be outputted using an indicator (not illustrated), for example.

The description of operation example 2 has been given thus far. When it is determined that there is a ground fault in step S202, it can be estimated that a ground fault occurs at the side of bridge rectifier 14 where ground fault detecting circuit 21 exists (the DC interval). When it is determined that there is a ground fault in step S205 after it is determined that a ground fault does not exist in step S202, it can be estimated that a ground fault occurs at the side (the AC interval) of bridge rectifier 14 which is opposite to ground fault detecting circuit 21.

In step S202, since value V1 of the test voltage is smaller than that of forward voltage Vf, the ground fault detection of the DC interval may be performed. Meanwhile, when it is determined that there is a ground fault in step S205, value V2 of the test voltage is larger than that of forward voltage Vf, and hence the ground fault detection of at least one of the DC interval and the AC interval can be performed.

By combining step S202 and step S205, it is possible to identify in which one of the DC interval and the AC interval the ground fault occurs.

In this way, it is possible to estimate where the ground fault occurs by performing the ground fault detection in two stages as in this operation example. Further, it is possible to detect the ground fault by automatically changing the detection interval (range). Furthermore, in the operation example, the detection interval is changed in two stages, but may be changed in two stages or more.

Further, in operation example 2, the test voltage may be an AC voltage.

Further, a predetermined value used to determine the ground fault may be a different value according to the test interval and the test voltage to be applied.

Further, operation example 2 may be performed alone without the replacement of step S104 to step S105 of operation example 1.

Further, in operation examples 1 and 2, the AC voltage serving as the test voltage is not limited to a sine wave, and may be a rectangular wave or a triangular wave.

According to the embodiment, it is possible to detect the ground default occurring in the AC interval by performing a control so that a test voltage larger than the forward voltage of the diode included in the bridge rectifier is outputted.

Further, according to the embodiment, it is possible to estimate where the ground fault occurs by performing a control on the test voltage to be outputted so that a voltage of a value larger or smaller than the forward voltage of the diode included in the bridge rectifier is selectively outputted.

Further, according to the embodiment, it is possible to detect the ground fault occurring in the AC interval even when the resonance capacitor is provided in the AC interval, by outputting an AC voltage as the test voltage.

While the embodiment has been described, the present invention is not limited to the description above, and various modifications may be made within a scope without departing from the gist of the present invention.

The disclosure of Japanese Patent Application No. 2012-043048 filed on Feb. 29, 2012 including the specification, drawings, and abstract is incorporated herein by reference in its entirety.

INDUSTRIAL APPLICABILITY

An in-vehicle charging apparatus according to the present invention is suitable for ground fault detection when a battery mounted on a vehicle is charged using a predetermined power supply.

REFERENCE SIGNS LIST

10 Power supply circuit
11 Primary inverter
12 Primary transformer
13 Secondary transformer
14 Bridge rectifier
15a, 15b, 15c, 15d Diode
16 Choke coil
17 Capacitor
18 P-side relay
19 N-side relay
20 Vehicle-side GND
21 Ground fault detecting circuit
22 Battery
23 Control section
24, 25 Resonance capacitor
100 In-vehicle charging apparatus

The invention claimed is:

1. An in-vehicle charging apparatus that charges a battery mounted on a vehicle, the in-vehicle charging apparatus comprising:
    a bridge rectifier that converts an alternating current supplied from a power supply into a direct current;
    a ground fault detecting circuit that is provided at a side of the bridge rectifier where the direct current obtained by the conversion of the bridge rectifier flows, that outputs first and second test voltages, and that detects a ground fault occurring in the in-vehicle charging apparatus, based on a test current which changes in response to the presence or absence of a ground fault resistance; and
    a control section that controls the ground fault detecting circuit so that the ground fault detecting circuit outputs the first and second test voltages,
    wherein:
    the control section controls the ground fault detecting circuit so that the ground fault detecting circuit outputs respective test voltages of both the first test voltage of a value smaller than the forward voltage of the diode included in the bridge rectifier and the second test voltage of a value larger than the forward voltage of the diode included in the bridge rectifier,
    the control section determines that a ground fault occurs in a DC interval on the side of the bridge rectifier where the ground fault detecting circuit is present, if the ground fault detecting circuit detects a test current larger than a first predetermined value when the first test voltage is output, and
    the control section determines that a ground fault occurs in an AC interval on a side of the bridge rectifier which is opposite to the side of the bridge rectifier where the ground fault detecting circuit is present, if the ground fault detecting circuit does not detect the test current larger than the first predetermined value when the first test voltage is output but the ground fault detecting circuit detects a test current larger than second predetermined value when the second test voltage is output.

2. The in-vehicle charging apparatus according to claim 1, wherein the test voltage is an AC voltage.

3. The in-vehicle charging apparatus according to claim 1, further comprising a resonance capacitor that is provided at a side of the bridge rectifier where the alternating current supplied from the power supply of the bridge rectifier flows.

* * * * *